United States Patent [19]
Pataut

[11] Patent Number: 5,122,765
[45] Date of Patent: Jun. 16, 1992

[54] DIRECT MICROWAVE MODULATION AND DEMODULATION DEVICE

[75] Inventor: Gérard Pataut, Gif sur Yvette, France

[73] Assignee: Thomson Composants Microondes, Puteaux, France

[21] Appl. No.: 448,992

[22] Filed: Dec. 12, 1989

[30] Foreign Application Priority Data

Dec. 20, 1988 [FR] France ............... 88 16802

[51] Int. Cl.[5] ............ H04L 27/36; H04L 27/38
[52] U.S. Cl. ..................... 332/105; 329/305; 329/306; 375/39; 375/53; 375/67; 375/80; 331/117 FE; 331/117 D; 331/177 V
[58] Field of Search .......... 329/306, 307, 308, 309, 329/305, 302, 323, 325, 326, 346, 358, 360; 332/103, 104, 105, 100, 127, 128, 144, 151, 152, 161; 375/39, 52, 53, 67, 80, 81, 83, 86

[56] References Cited

FOREIGN PATENT DOCUMENTS 2358025 2/1978 France .

OTHER PUBLICATIONS

Philips Journal of Research, vol. 41, No. 3, 1986, pp. 219–231, Eindhoven, NL, R. A. Brown et al., "Some Features of Signal Demodulation Resulting from the Practical Implementation of a Direct Conversion Radio Receiver".

IEEE Gallium Arsenide Integrated Circuit Symposium, Portland, Oreg., Oct. 13-16, 1987, pp. 227-230, IEEE, New York, US, K. W. Lee et al., "Push-Push, Frequency-Doubling, MMIC Oscillators".

Prentice-Hall, Inc., Englewood Cliffs, N.J., US, 1984, pp. 180-183, G. Gonzales, "Microwave Transistor Amplifiers Analysis and Design".

Primary Examiner—Siegfried H. Grimm
Attorney, Agent, or Firm—Oblon, Spivak, McClelland, Maier & Neustadt

[57] ABSTRACT

A microwave circuit intended for either direct modulation or direct demodulation of a microwave link communications signal is characterized in that a local oscillator (8) is incorporated in the circuit. The local oscillator supplies two signals that are in phase opposition at 180 degrees. Each signal is sent to a phase shifter. The first phase shifter (9) supplies two signals that are in quadrature, at 0 and 90 degrees. The second phase shifter supplies two signals in quadrature at 180 and 270 degrees. The 0 and 180 degree signals are sent to a first mixer (2), while the 90 and 270 degree signals are sent to a second mixer (3). In the case of a modulator, the first and second mixers receive, respectively, in-phase and quadrature signals, and the outputs of the mixers are combined to form a modulated signal. In the case of a demodulator, a modulated signal is applied through a ÷2 divider to inputs of the two mixers, and in-phase and quadrature signals are obtained at respective mixer outputs.

6 Claims, 3 Drawing Sheets

DIRECT MICROWAVE MODULATION AND DEMODULATION DEVICE

BACKGROUND OF THE INVENTION

1. Field of the Invention

The present invention relates to a direct microwave modulation and demodulation device. The device is designed to be in the form of an integrated circuit and is particularly intended for data processing in the field of microwave link communications.

Since the circuits used for direct modulation and demodulation are virtually identical except for minor details, the present invention shall be explained with reference to a demodulator for the sake of clarity. Details that are specific to a modulator shall be given where necessary.

2. Description of the Prior Art

Classical circuit designs for digital microwave link communications receivers always include circuits operating at intermediate frequencies. These intermediate frequency circuits carry out the preamplification, filtering and amplification with automatic gain control (AGC) necessary to provide a coherent, constant amplitude signal to the demodulator.

The principle of direct modulation, which is known in the art, consists in transposing the intermediate frequency operations to a base band and regenerating the modulated carrier in the demodulation stage. Compared with classical approaches, direct modulation obviates the need for a number of circuits, including: 3 dB couplers, 90 degree phase shifters, a voltage-controlled oscillator, a low-noise AGC amplifier, and mixers.

In prior art direct demodulation, a local oscillator delivers a single signal that supplies two phase shifter stages. A first phase shifter accordingly produces an in-phase signal P (0 degrees) and a quadrature signal Q (90 degrees). In a second stage within the mixer, a second phase shifter converts the in-phase signal into two signals that are 0 and 180 degrees out of phase, while a third phase shifter converts the quadrature signal into two signals that are 90 and 270 degrees out of phase.

Also, prior art demodulators are generally in the form of hybrid circuits in which phase shifts are obtained by means of delay lines having various propagation modes; microstrip lines, slotted lines, coplanar lines.

If monolithic gallium arsenide integrated circuit technology is used, the length of the delay line becomes prohibitive, and it is therefore necessary to turn to other designs, e.g. employing localized elements.

SUMMARY OF THE INVENTION

The present invention teaches a different receiver front end that is nevertheless functionally equivalent. The local oscillator (OL) produces two voltages that are exactly in phase opposition. Each component is then divided in quadrature prior to being used for mixing. In this colution, the 0-180 degree phase shift is generated by the local ascillator itself and only two 90 degree shifts need be implemented on the integrated circuit, as opposed to three in a classical design (once 90 degrees followed by twice 180 degrees).

The integrated circuit incorporating the above novel demodulator with the low-noise amplifier forms a receiver circuit having a reduced number of components. Accordingly, it can produced with a higher yield.

Furthermore, the structure according the present invention can also be used for modulators in transmitter circuits.

More specifically, the present invention concerns a device for direct modulation or demodulation of microwaves, said device being comprised of first and second mixers that deliver (in demodulation) or receive (in modulation) respectively an in-phase signal and a quadrature signal, said first mixer being controlled by two signals whose phase angles are 0 and 180 degrees respectively, said second mixer being controlled by two signals whose phase angles are 90 and 270 degrees respectively, the four signals being delivered by first and second phase shifters, wherein said device further comprises a voltage controlled local oscillator that supplies first and second signals in phase opposition, said first signal having a 0 degree phase angle and being supplied to said first phase shifter, and said second signal having a 180 degree phase opposition and being supplied to said second pahse shifter.

BRIEF DESCRIPTION OF THE DRAWINGS

The present invention shall be better understood and its advantages shall become clearer upon reading the following description of an embodiment with reference to the appended drawings in which.

DESCRIPTION OF THE PREFERRED EMBODIMENTS

Figure 1:
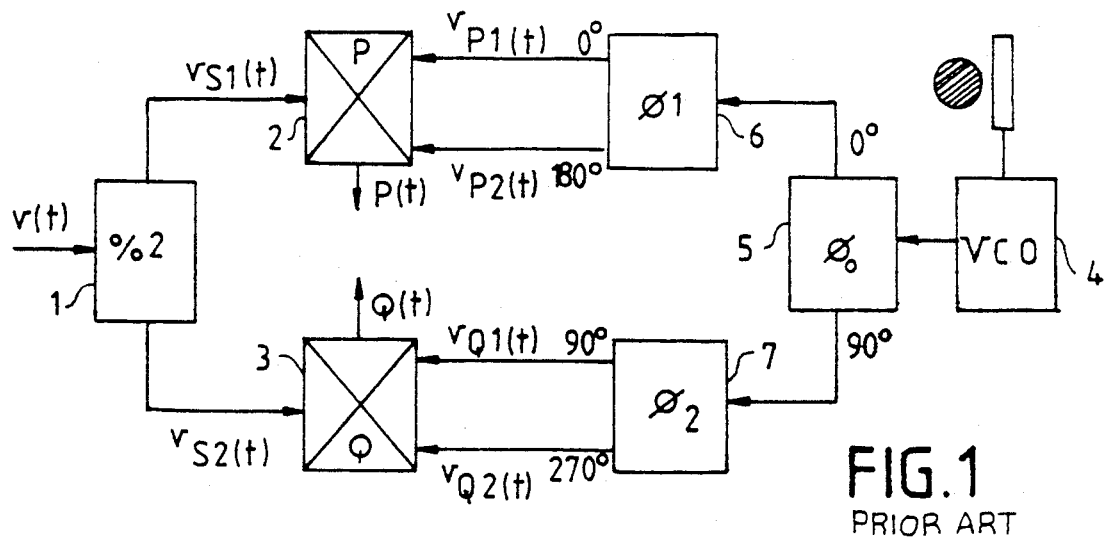
FIG. 1 is a block diagram of a prior art demodulator.

The novelty of the present invention can be better understood through a comparison with a classical circuit. Since the invention shall be explained in terms of a demodulator, the prior art of FIG. 1 also relates to a demodulator.

The latter forms part of a data processing chain in which the modulation method used is of the vectorial type, i.e. in which the carrier and its quadrature component are linearly modulated. Accordingly, the single signal from the local oscillator (LO) is divided into two components in quadrature between the two in-phase (P) and quadrature (Q) channels. The mixers in each of the two channels can be either single, double or quadruple types. In direct modulation, the need for balanced structures calls for the introduction of a 0 to 180 degree phase shift between each local oscillator diode, in the case of a diode mixer.

A receiver front end for vectorially modulated signals therefore carries out a first 0-90 degree phase shift on the OL signal, and then a 0-180 degree phase shift on each of the mixers. This has the effect of producing the four phases—0, 180, 90 and 270 degrees—on the OL signal In FIG. 1, the input signal v(t) is applied to a ÷2 divider 1 and fed to two mixers, respectively in phase P and in quadrature Q, 2 and 3. Demodulation is carried out by a voltage controlled oscillator (VCO) that is feedback controlled by a microstrip and a dielectric resonator. The single output from the VCO is sent to a first phase shifter 5 that produces a 0 degree phase signal and the 90 degree quadrature signal.

The 0 degree phase signal is sent to a second phase shifter 6 that supplies the 0 degree phase signal ($v_{P1}(t)$) and the 180 degree phase opposition signal ($v_{P2}(t)$). These two signals are sent to the same mixer 2 of the in-phase channel.

In a symmetric manner, the 90 degree quadrature signal is sent to a third pahse shifter 7 that supplies the 90 and 270 degree signals sent to the common mixer 3 of the quadrature channel.

In the above demodulator, the input signal $v(t) = A \sin(\omega_o t + \phi(t))$ is divided between the two mixers as follows:

$$vs1(t) = A_P \sin(\omega_o t + \phi(t));$$

and $$vs2(t) = A_Q \sin(\omega_o t + \phi(t)),$$

where $\phi(t)$ is the modulation conveyed by the carrier $\omega_o$.

For a modulation with 4 phase states, the modulation is expressed as:

$$\phi(t) = \pi/4 + k\pi/2,$$

where $k \in (0,1,2,3)$.

The signal supplied by the voltage controlled oscillator is expressed as:

$$v_{co}(t) = B \sin(\omega_o t + \theta),$$

and after both types of phase shift $\phi_0$ and $\phi_1$ or $\phi_2$, the four components become:

$$v_{P1}(t) = B_{P1} \sin(\omega_o t + \theta);$$

$$v_{P2}(t) = B_{P2} \sin(\omega_o t + \theta + \pi);$$

$$v_{Q1}(t) = B_{Q1} \sin(\omega_o t + \theta + \pi/2);$$

$$v_{Q2}(t) = B_{Q2} \sin(\omega_o t + \theta + \pi/2 + \pi)$$

After filtering, the output from mixer P becomes:

$$P(t) = C_p \cos \phi(t);$$

and the output from mixer Q becomes:

$$Q(t) + C_Q \sin \phi(t),$$

where $C_P$ and $C_Q$ are coefficients.

A regenerator reconstitutes the stream of transmitted data on the basis of the above two wave trains P(t) and Q(t).

Figure 2:
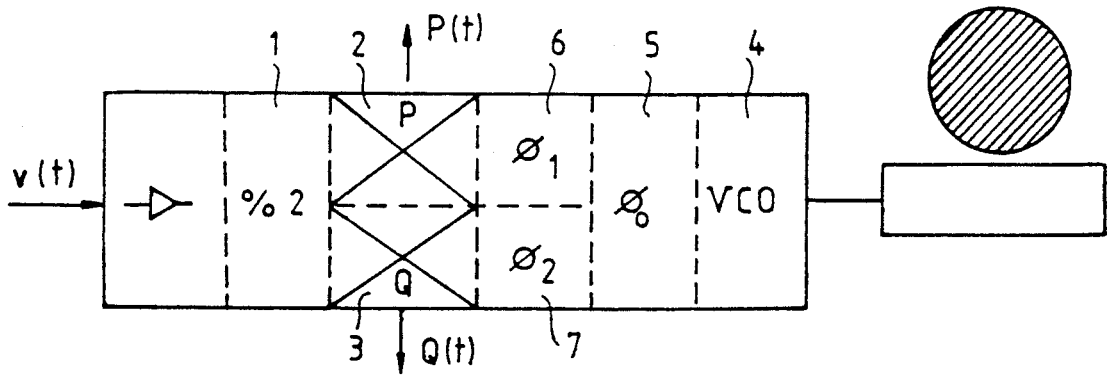
FIG. 2 is a wiring diagram of a prior art demodulator.

FIG. 2 shows a physical layont of a receiver comprising the direct demodulation device of FIG. 1. A receiver is demodulator to which are added a low-noise amplifier with AGC and a VCO. Such a receiver comprises three phase shifters 5, 6, 7, whether it be constructed as a hybrid or as an integrated circuit.

Figure 3:
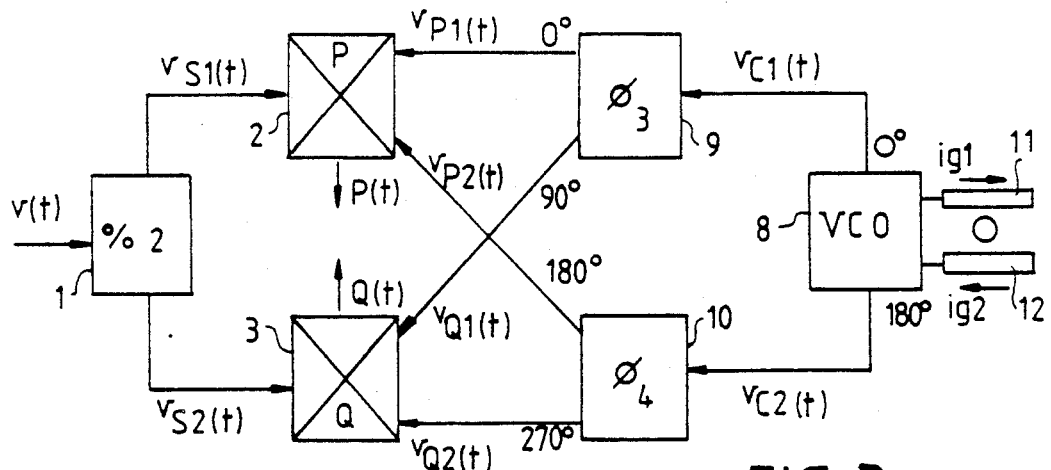
FIG. 3 is a block diagram of a demodulator according to the present invention.

The direct demodulation device according to the present invention is shown in FIG. 3. It is comprises of only two pahse shifters 9, 10 since the oscillator 8 is included the demodulator and generates two 180 degree phase shifted signals at source. Phase shifters 9, 10 generate two 90 degree phase shifted signals.

Accordingly, whereas a prior art device would employ a 90 degree phase shifter 5 followed by two 180 degree phase shifters 6, 7, the present invention uses an oscillator 8 followed by two 90 degree phase shifters 9, 10. It follows that two outputs, respectively at 90 and 180 degrees, of the phase shifters 9, 10 are permuted. Phase shifter 9 drives one input at each of the two in-phase and quadrature mixers, P, Q. In a symmetric manner, phase shifter 10 also drives one input on each of the two mixers.

The oscillator 8 produces two voltages in phase oppositions:

$$V_{c1}(t) = V_1 \sin(\omega_o t + \theta);$$

and $$V_{c2}(t) = V_2 \sin(\omega_o t + \theta + \pi)$$

The above two voltages themselves produce two voltages in quadrature downstream of the phase shifters 9, 10:

$$V_{P1}(t) = B_{P1} \sin(\omega_o t + \theta)$$

$$V_{Q1}(t) = B_{Q1} \sin(\omega_o t + \theta + \pi)$$

$$C_{P2}(t) = B_{P2} \sin(\omega_o t + \theta + \pi)$$

$$C_{Q2}(t) = B_{Q2} \sin(\omega_o t + \theta + \pi + \pi/2)$$

There is thus obtained the four components of a classical demodulator structure. Accordingly, the same wave trains P(t) and Q(t) are produced at the demodulator output. The novelty of the present structure is of inverting the 90 and 180 degree phase shifts and bringing the 180 degree phase shift to the level of the oscillator where it can easily be carried out.

Figure 4:
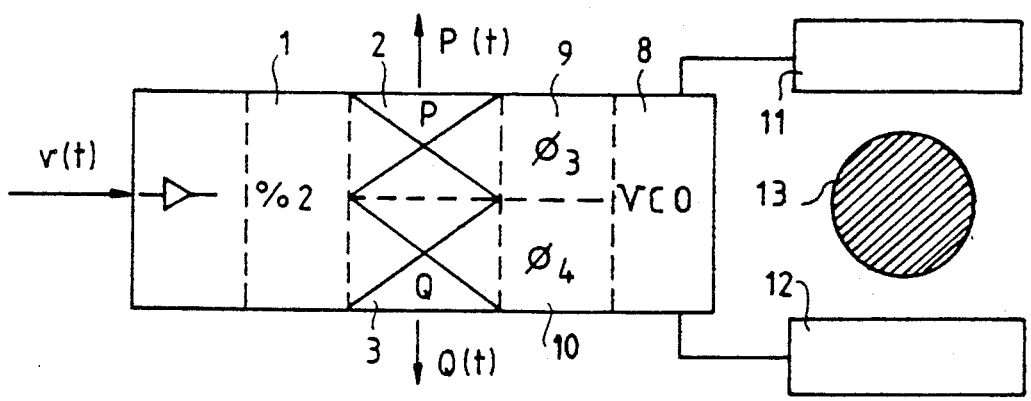
FIG. 4 is a wiring diagram of a receiver according to the invention.

FIG. 4, taken in contrast with FIG. 2, demonstrates that the demodulator according to the present invention is simpler than that of the prior art, since there are only two phase shifters 9, 10. The description of the structure of each part of the demodulator shall show that the present circuit lends itself particularly to well to integration, especially on group III-V materials adapted to microwaves, such as GaAs.

Figure 5:
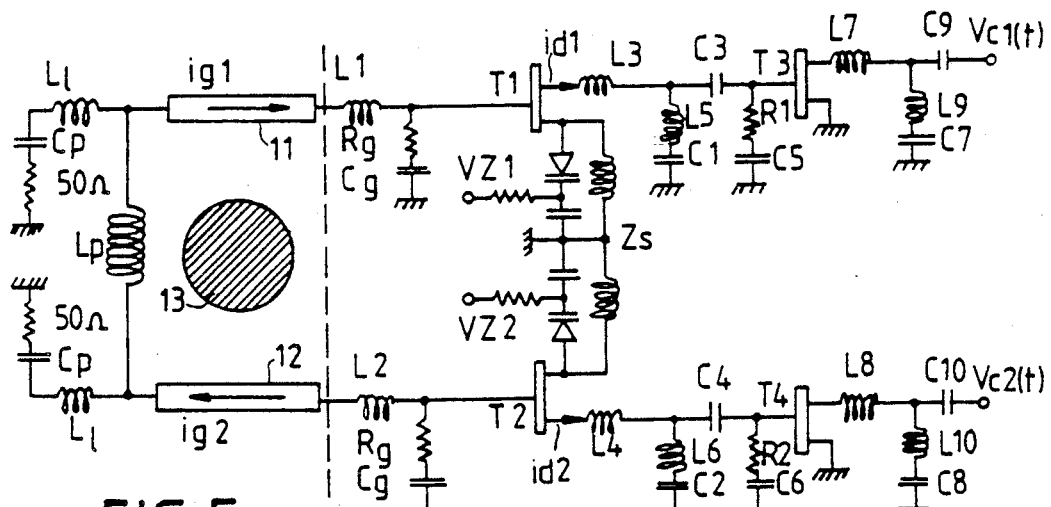
FIG. 5 is a circuit diagram of the oscillator supplying two signals in quadrature, according to the present invention.

The balanced 0-180 degree oscillator, shown in FIG. 5, is of the push-pull type and its operation is partially known, e.g. from French Patent No. 86 08584 from the applicant. But the oscillator of the present invention has been modified with respect to the prior art oscillator in order to deliver two output signals in phase opposition, as opposed to a single signal at a doubled frequency.

All the elements appearing on the left of the dotted line are in hybrid technology. They comprise two microstrip propagation lines 11, 12 on an insulating substrate terminated by 50 ohm loads. An inductor $L_P$ connecting the two lines puts in series the low-frequency noise generators which cancel each other out. The two lines, which carry currents ig1 and ig2 flowing in opposite directions, are coupled by a dielectric resonator 13 connected therebetween.

All the elements appearing on the right of the dotted line are made in gallium arsenide integrated circuit technology. They first of all comprise transistors T1 and T2 functioning as an oscillator and whose drain currents $id_1$ and $id_2$ are in phase opposition, since their gate currents $ig_1$ and $ig_2$ are also in phase opposition.

A source impedance, generally designated Zs, connects together the sources of the two transistors T1 and T2. The impedance is comprised of two varactor diodes controlled by respective voltages Vz1 and Vz2, enabling the introduction of the frequency change required during demodulation.

The transistors T3 and T4 function as an amplifier respectively loading transistors T1 and T2 with impedances that are optimized for oscillation. They provide the output level for each channel and the isolation with respect to the circuit application (load impedance).

Transistors T3 and T4 respectively deliver the in-phase signal Vc1 (t) and the phase opposition signal Vc2 (t), which are sent to the phase shifters 9 and 10.

In the above oscillator, the signals are in phase opposition by virtue of the structure, so long as the two channels are electrically and geometrically symmetrical. These criteria are well satisfied by the implementation in a gallium arsenide integrated circuit.

The two phase shifters 9, 10 are of the same type and their outputs deliver two signals in quadrature. More specifically, one of the signals has a 45 degree phase advance, while the other has a 45 degree phase delay; but the two signals do indeed have a 90 degree relative phase shift. The circuit diagram for one of the phase shifters is shown in FIG. 6.

At the input E, the signal—Vci (t), for instance—is divided into two in a Wilkinson type structure with localized elements: C11, L11, L12, R11, L111, L112.

Figure 6:
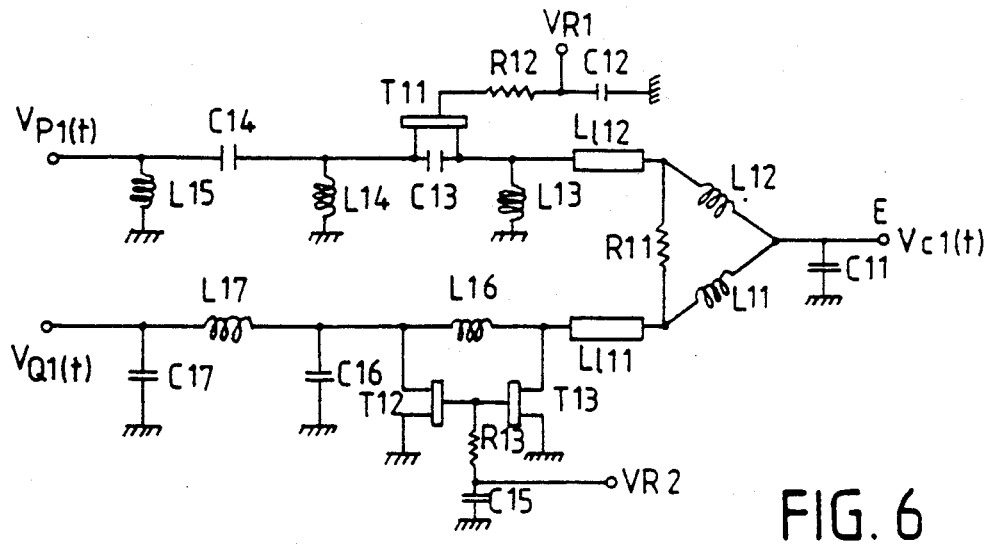
FIG. 6 is a circuit diagram of a phase shifter producing two signals in quadrature, according to the invention.

In a first channel, shown in the top portion of FIG. 6, the circuit defined by the elements L13, L14, C13, T11, R12 and C12 forms a variable phase-shift cell controlled by the gate voltage of an unbiased transistor T11. The regulating voltage VR1 acting on the gate of T11 increases or decreases the capacitance of the latter, which is connected in parallel with C13. The phase shift for the above channel is finally obtained by adjusting the circuit elements L14, C14 and L15.

The signal VP1 (t) output from this channel is phase shifted by +45 degrees with respect to the signal voltage Vc1 (t) at the input E.

In a second channel, the circuit elements L16, T12, T13, R13 and C15 form a variable attenuator which uses two unbiased transistors. The attenuation is controlled by the adjustment voltage VR2 applied between R13 and C15. A second circuit, defined by elements C16, L17 and C17, allows to obtain an output signal VQ1 (t) that is phase shifted by −45 degrees, and hence in quadrature with signal VP1 (t) from the first channel.

The equalizing of amplitude between the two channels is carried out by transistors T12 and T13, and the 90 degree phase shift is regulated by transistor T11, all three transistors being unbiased (Vds=0 V).

Figure 7:
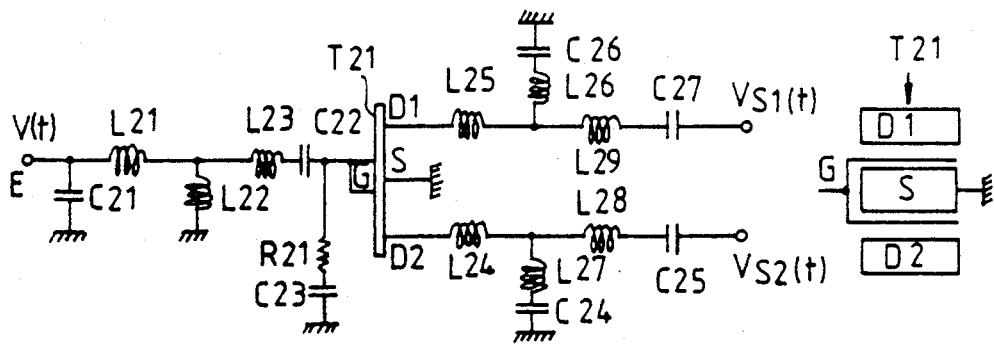
FIG. 7 is a circuit diagram of a signal input divider for a demodulator according the invention.

The input divider for the direct modulation or demodulation device can be of a known design. However, there is shown in FIG. 7 an original design that has been specially produced for the purposes of integration, and in particular for integration on gallium arsenide.

Here, the principle involves applying the signal V (t) present at the input E—and which must be divided into two equal signals—to the single bifurcated gate of a transistor T21 having two drains. The transistor is shown on the right-hand portion of FIG. 7. The two separate drains provide the two output channels VS1 (t) and VS2 (t).

If the circuit elements are strictly identical for each channel, the output signals will have the same phase and amplitude. The advantage of the above divider is that the use of active elements can provide a gain for each channel and a good isolation of the channels with respect to the input.

Up to this point, the present invention has been described with reference to a direct demodulator. However, if the invention concerns a direct modulator then the divider circuit of FIG. 7 should be replaced by a combiner circuit, as shown in FIG. 8.

Figure 8:
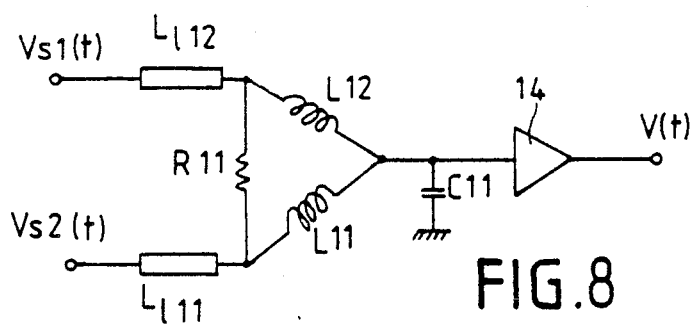
FIG. 8 is a circuit diagram of an output combiner for a modulator according to the invention.

In the latter case, the input signals are signals P (t) and Q (t) of FIG. 3, and the combiner of FIG. 8 combines in phase the two modulated channels output by the mixers 2, 3. This combiner is in fact a Wilkinson type circuit which is identical to that incorporated in the phase shifters 9, 10.

The combiner is followed by an automatic gain control amplification stage for transmitting the modulated signal, the amplification stage replacing the low-noise amplifier at the input for the case of demodulation.

Figure 9:
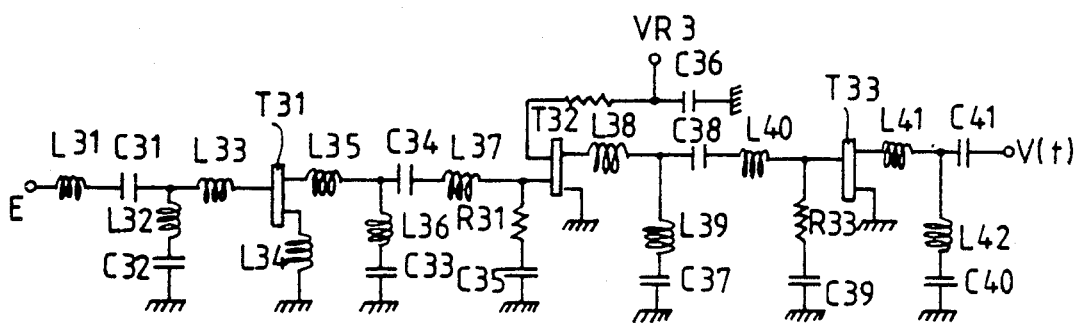
FIG. 9 is a circuit diagram of the low-noise AGC amplifier.

Returning to a direct demodulation device, FIG. 9 shows a circuit diagram for the low-noise, automatic gain control amplifier.

The amplifier has a three-stage structure, each stage providing a specific function. The first stage (transistor T31) has an input adapted for a low noise factor. The second stage (transistor T32) uses a dual-gate transistor, the second gate of which is biased by a voltage VR3 that controls the gain for that stage. The last stage (transistor T33) has a very wide transistor to give a very linear response to the amplifier—since transistor T33 is wide, it operates far from its saturation point.

The mixers 2, 3 are not covered in detail. They have known, balanced type structures, and can be constructed from diodes or transistors.

The direct modulation or demodulation devices according to the present invention are used for processing microwave signals, e.g. in line-of-sight communications or radar. They are defined in the following claims.

What is claimed is:

1. A device for direct modulation or demodulation of microwaves, said device being comprised of first and second mixers that deliver (in demodulation) or receive (in modulation) respectively an in-phase signal and a quadrature signal, said first mixer being controlled by two signals whose phase angles are 0 and 180 degrees respectively, said second mixer being controlled by two signals whose phase angles are 90 and 270 degrees respectively, the four signals being delivered by first and second phase shifters, wherein said device further comprisies a voltage controlled local oscillator that supplies first and second signals in phase opposition, said first signal having a 0 degree phase angle and being supplied to said first phase shifter, and said second signal having a 180 degree phase opposition and being supplied to said second phase shifter.

2. A device as claimed in claim 1, wherein said first and second phase shifters each deliver two signals that are in quadrature, said two signals delivered by said first phase shifter, respectively having phase angles of 0 and 90 degrees, being supplied to said first said and second mixers respectively.

3. A device as claimed in claim 1, wherein said voltage controlled oscillator is comprised of first and second field effect oscillator transistors that are connected in parallel, and wherein: the sources are interconnected via a variable impedance comprised of two varactors controlled by two voltages; the gates are controlled by a circuit comprised of two microstrip lines coupled to a single dielectric resonator, the current flow in said microstrip lines being in mutually opposite directions; the drain currents are accordingly in phase opposition; said oscillator further comprising two additional amplifier transistors, one per output channel, whose gates are controlled by the drain currents of said first and second oscillator transistors.

4. A device as claimed in claim 1, wherein each of said two phase shifters is comprised of:
  a Wilkinson type structure comprised of localised elements, having an input receiving a signal from said oscillator, said structure dividing said oscillator signal into two signals sent respectively to:
  a first in-phase channel comprising a variable phase shift circuit controlled by an unbiased transistor controlled by a regulating voltage, and a fixed phase shift circuit; and
  a second channel in quadrature comprising a variable attenuator circuit controlled by two unbiased transistors, controlled by a regulating voltage, and a fixed phase shift circuit, said two regulating voltages serving to adjust the balance of the amplitudes and the 90 degree phase shift angle of said two channels.

5. A device as claimed in claim 1, wherein, in the case of said device being a demodulator, a modulated signal is applied to said first and second mixers through a $\div 2$ divider which is comprised of a field effect transistor having a single, bifurcated gate and two separate drains, the source thereof being grounded.

6. A device as claimed in claim 1, wherein, in the case of said device being a modulator, a Wilkinson type combiner is used which has first and second inputs receiving the outputs from said first and second mixers, and an output delivering a modulated signal.

* * * * *